United States Patent [19]

Ikossi-Anastasiou et al.

[11] Patent Number: 5,772,907
[45] Date of Patent: Jun. 30, 1998

[54] LACTIC ACID TREATMENT OF INP MATERIALS

[75] Inventors: Kiki Ikossi-Anastasiou, Baton Rouge, La.; Steve C. Binari, Annadale; J. Brad Boos, Springfield, both of Va.; Galina Kelner, Potomac, Md.

[73] Assignee: The United States of America as represented by the Secretary of the Navy, Washington, D.C.

[21] Appl. No.: 646,537

[22] Filed: May 8, 1996

[51] Int. Cl.⁶ .................................................. G23F 1/00
[52] U.S. Cl. ............................................ 216/100; 216/108
[58] Field of Search ........................... 252/79.4; 216/100, 216/108

[56] References Cited

U.S. PATENT DOCUMENTS

| | | | |
|---|---|---|---|
| 4,428,795 | 1/1984 | Kohl et al. | 156/363 |
| 4,686,001 | 8/1987 | Okazaki | 438/47 |

FOREIGN PATENT DOCUMENTS

| | | | |
|---|---|---|---|
| 57-9560 | 1/1982 | Japan | 29/91 |
| 57-187940 | 11/1982 | Japan | 21/306 |
| 59-150087 | 8/1984 | Japan | 21/304 |
| 5-132865 | 5/1993 | Japan | 1/46 |
| 521921 | 7/1974 | U.S.S.R. | |
| 784635 | 7/1979 | U.S.S.R. | 21/30 |
| 1135382 | 2/1983 | U.S.S.R. | 21/30 |

OTHER PUBLICATIONS

K. Ikossi–Anastasiou, "Wet Chemical Etching with Lactic Acid Solutions for InP–Based Semiconductor Devices", pp. 3558–3584 J. Electrochem. Soc. vol. 142, #10, Oct. 1995.

*Primary Examiner*—R. Bruce Breneman
*Assistant Examiner*—Anita Alanko
*Attorney, Agent, or Firm*—Thomas E. McDonnell; George Kap

[57] ABSTRACT

The use of lactic acid or its derivative in compositions to etch or polish materials containing indium phosphide results in treated surfaces that have reduced surface roughness compared to the surfaces treated with compositions devoid of lactic acid or its derivative. Indium phosphide surfaces treated with compositions containing lactic acid can have treated surfaces that are smooth or mirror-like, meaning that surface irregularities thereon are less than about 50 Å.

6 Claims, 4 Drawing Sheets

LACTIC ACID TREATMENT OF INP MATERIALS

FIELD OF INVENTION

The present invention pertains to treating of InP-containing materials with compositions containing lactic acid.

BACKGROUND OF INVENTION

One of the challenges in fabricating indium phosphide based electronic devices is the requirement of etching well defined areas with good morphology surface finish. Indium phosphide is notorious for the appearance of surface structures after etching. The surface finish of indium phosphide with most of the reported etches till now resulted in a surface covered with structures consisting of pits or hillocks of various crystallographic shapes. These surface defects are undesirable, degrade the performance of the fabricated devices, and can lead to a premature failure of the devices.

With the emergence of heterostructure devices involving a variety of ternary and quaternary compounds containing indium phosphide, selective etches are desirable that etch different layers with different etch rates. Furthermore, for microwave type of devices and advanced devices requiring small areas as well as for certain high density applications, a controllable means of etching with minimum undercut is desirable. The undercuts on electronic devices distort the dimensions of such devices and complicate processing thereof.

OBJECTS AND SUMMARY OF INVENTION

It is an object of this invention to treat materials containing indium phosphide in order to obtain good morphology finish.

It is another object of this invention to obtain electronic devices containing indium phosphide with etched patterns of at least micron and sub-micron dimensions.

It is another object of this invention to selectively etch heterostructures of indium phosphide, indium gallium arsenic phosphide, or other related compounds.

These and other objects of this invention are attained by treating materials containing indium phosphide or related compouns to obtain mirror-like surfaces with compositions containing lactic acid.

DETAILED DESCRIPTION OF INVENTION

Figure 1:
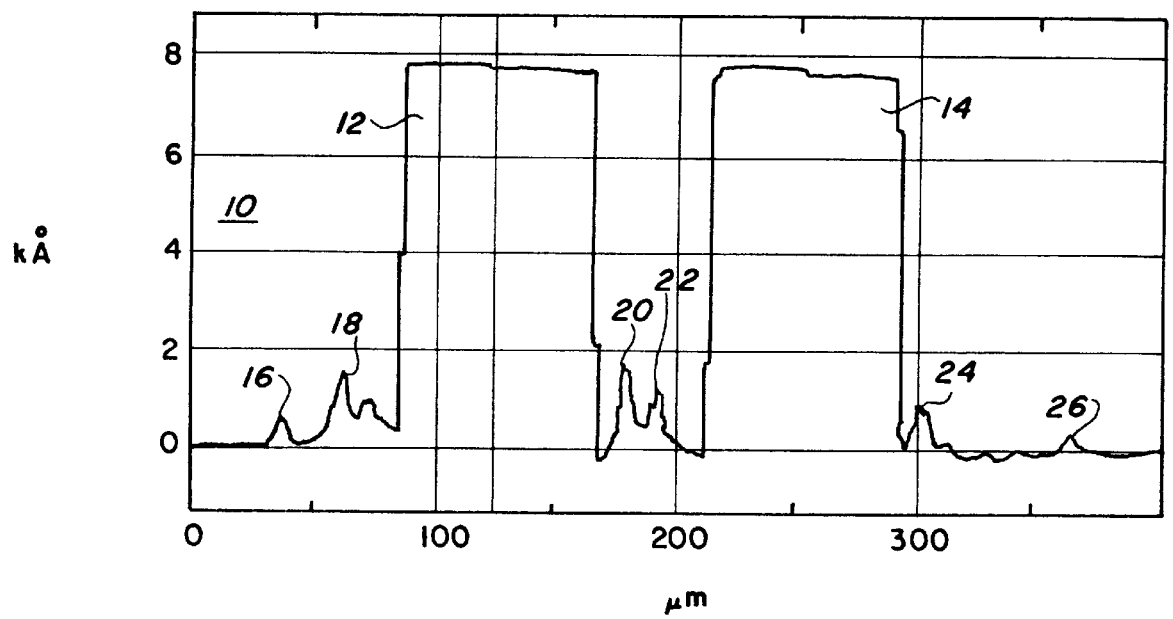
FIG. 1 is a graph of distance in microns (um) and height in kiloangstroms (kÅ) along the Y-axis of Alpha stepper measurements showing surface discontinuities in an indium phosphide (InP) surface after etching for 600 seconds with etching solutions $2H_2O:1HIO_3$.

This invention pertains to the use of lactic acid in etching or polishing of indium phosphide-containing materials in order to obtain surface morphology with reduced surface irregularities. More specifically, this invention pertains to the use of an effective amount of lactic acid to wet etch or polish an indium phosphide surface where the surface has reduced irregularities and is typically devoid of pits and hillocks of less than about 50 Å, and preferably less than about 1 Å. The desirable result includes smooth, mirror-like surface having surface roughness of less than about 50 Å above or below the horizontal denoting a perfectly smooth surface.

Various compositions can be used to polish or to etch indium phosphide material or material containing or based on indium phosphide. The indium phosphide related materials include compounds in Groups III–V of the Periodic Table and ternary and quarternary compounds thereof, such as, for example, InGaAsP.

The wet compositions of interest herein are typically prepared from pure electronic grade acids such as hydrochloric, sulfuric, iodic, acetic, nitric, phosphoric and others. Concentrated hydrochloric acid is defined herein as about 37% HCl by weight; concentrated phosphoric acid is about 85% $H_3PO_4$; concentrated lactic acid is about 88% $CH_3CHOHCOOH$; concentrated nitric acid is about 70% $HNO_3$; concentrated sulfuric acid is about 95–98% $H_2SO_4$; and concentrated iodic acid is crystalline solid 99.79%. If an acid other than a concentrated acid is used in preparing a composition herein, the amount thereof may have to be increased or decreased to equal the effectiveness of a concentrated acid. Whenever a composition is given herein and it contains an acid, amount of the acid given is that of a concentrated acid on volume basis.

Compositions of this invention are typically aqueous solutions and contain an effective amount of lactic acid to reduce surface roughness of a treated indium phosphide surface. It is believed that for purposes of this invention, at least 1% by volume, preferably 10% by volume, of lactic acid will be effective in reducing surface roughness of electronic devices made of indium phosphide or containing indium phosphide. The maximum effective amount of lactic acid in compositions disclosed herein will be determined by practical considerations, including the etch rate, which may decline with addition of lactic acid, and the degree of smoothness it is desisired to achieve. In iodic acid etches, such as $2H_2O:1HIO_3:1LA$, where two volumes of water are combined with one weight part of iodic acid and one volume of lactic acid, it is believed that maximum effective amount of lactic acid is about 25% by volume, assuming an etch rate of at least about 5 Å/second. In nitric acid etches, such as $2HNO_3:1HCl:2LA$, maximum effective amount of lactic acid is believed to be between about 40% and about 50% by volume, assuming an etch rate of less than about 300 Å/second or about 100 Å/second, respectively. In phosphoric acid etches, such as $2HCl:5H_3PO_4:2LA$, maximum amount of lactic acid is believed to be less than about 20% by volume, assuming the amount of phosphoric acid in the etch exceeds the amount of lactic acid and assuming a realistic etch rate.

Turning to the drawings herein, the graph of FIG. 1 illustrates Alpha stepper measurements of InP surface wherein horizontal distance of an electronic device is plotted on the x-axis in microns ($\mu$m) against surface discrepancies along the Y-axis in kiloangstroms (kÅ). Using a $2H_2O:1HIO_3$ etch on InP electronic device 10, an etched step 12 of about 8,000 Å in height was obtained in 600 seconds of etching at an etch rate of about 13 Å/second. Step 12 was obtained by coating certain portions of the InP electronic device 10 with a positive resist which protected the underlying surface from the etch. Surface morphology in FIG. 1 shows hillocks 16, 18. Hillock 16 appears to be less than 500 Å in vertical extent and hillock 18 appears to exceed 1,000 Å in vertical extent. Large surface irregularities are also present between steps 12 and 14 and to the right of or beyond step 14. Hillock 20 between step 12 and 14 is in excess 1,000 Å but below 2000 Å and hillock 22 appears to be about 1,000 Å in vertical extent. Beyond step 14, FIG. 1 shows hillocks 26, 24 of less than about 500 Å in vertical extent and other hillocks and pits of lesser vertical extent.

Figure 2:
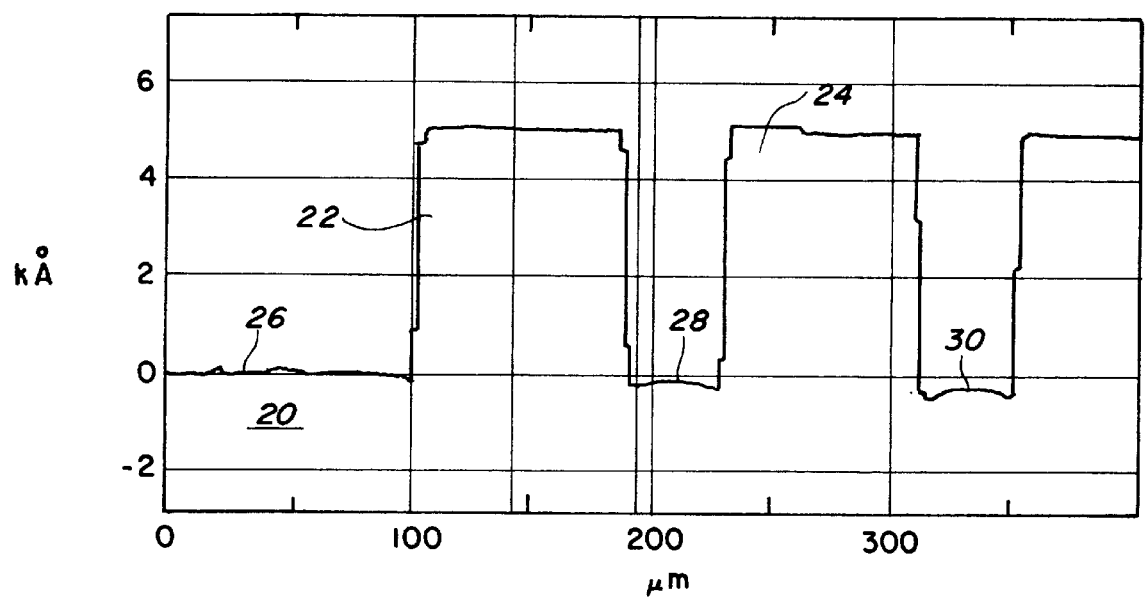
FIG. 2 is a graph similar to the one in FIG. 1 which shows surface characterics on InP surface after etching for 600 seconds with etching solutions $2H_2O:1HIO_3:0.5$ LA, where LA is a contraction of lactic acid.

FIG. 2 graph is similar to the graph of FIG. 1 except that the etch was $2H_2O:1HIO_3:0.5LA$ that was used on an InP electronic device 20 with spaced steps 22, 24. The etch rate for this etch was about 7.5 Å/second and the etch period was 600 seconds. Surface 26 appears to be quite smooth with surface discontinuities below about 200 Å. Between steps 22, 24 and to the right of step 24, surfaces 28, 30 appear to be smooth although below horizontally disposed surface 26.

Figure 3:
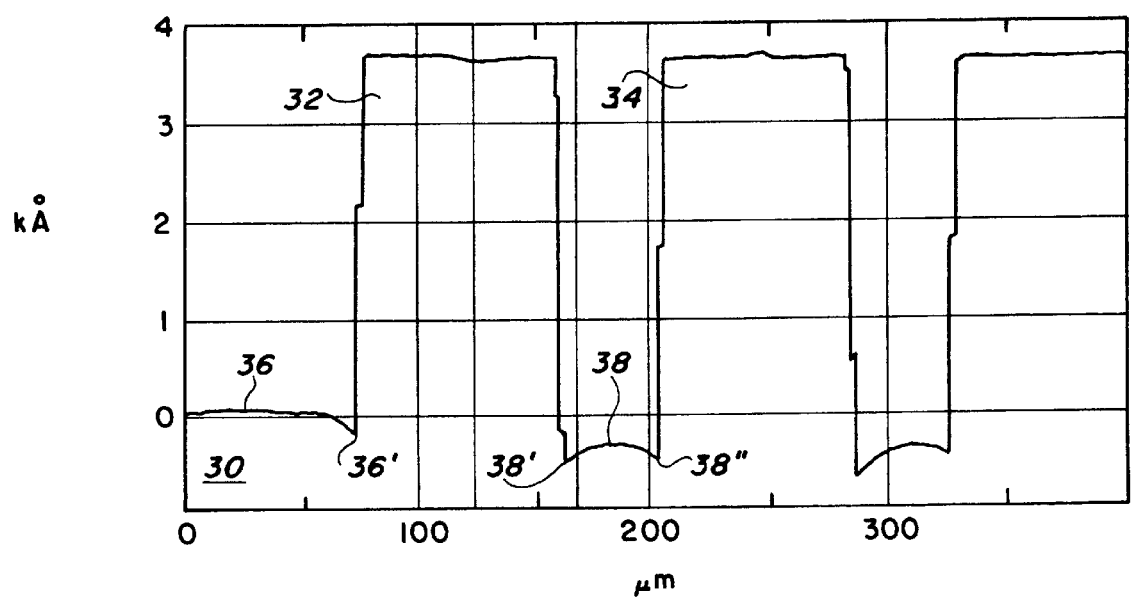
FIG. 3 is a graph similar to the one shown in FIG. 1 which shows surface characteristics on InP surface after etching for 600 seconds with etching solution $2H_2O:1HIO_3:1LA$.

FIG. 3 graph is similar to the graph of FIG. 2 but the etch used in FIG. 3 contained 0.5 volumes more of lactic acid.

To obtain the graph of FIG. 3, the etch solution was $2H_2O:1HIO_3:1LA$, the etch rate was about 6 Å/second and the etch period was 600 sec. The InP electronic device 30, as represented on the graph, had two spaced steps 32,34 with smooth surfaces 36, 38. Surface 36 was joined to step 32 through trench 36', which was below surface 36, and surface 38 was below surface 36 and was joined to step 32 via trench 38' and to step 34 via trench 38''. Trenches 38' and 38'' were below surface 38. In spite of the trenches appearing near masked areas, it should be noted that surfaces 36, 38 were smooth or mirror-like.

Figure 4:
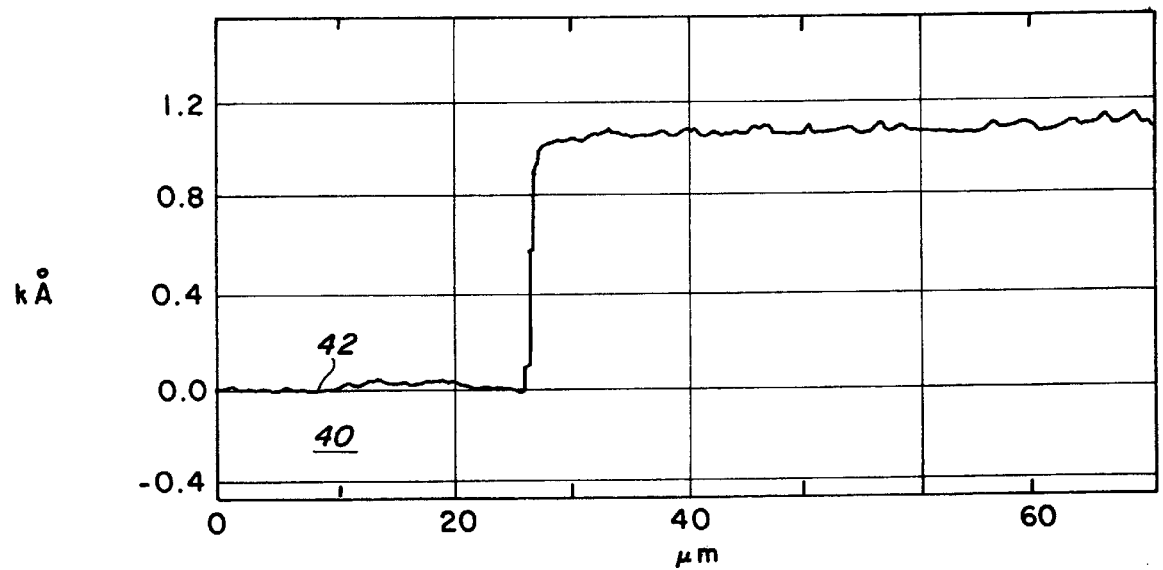
FIG. 4 is a graph similar to the one shown in FIG. 1 which shows surface characteristic on InP surface after etching for 700 seconds with etching solution $2H_2O:1HIO_3:4LA$.

FIG. 4 graph is similar to the graph of FIG. 3 except the etch used in conjunction with FIG. 4 was $2H_2O:1HIO_3:4LA$ which was used on InP electronic device 40, as represented on the graph, for 700 seconds and had etch rate of about 1.3 Å/second. FIG. 4 shows a relatively smooth surface 42 and demonstrates that a smooth, mirror-like surface can be obtained with etch solution of $2H_2O:1HIO_3:4LA$ at an etch rate of about 1.3 Å/second.

Figure 5:
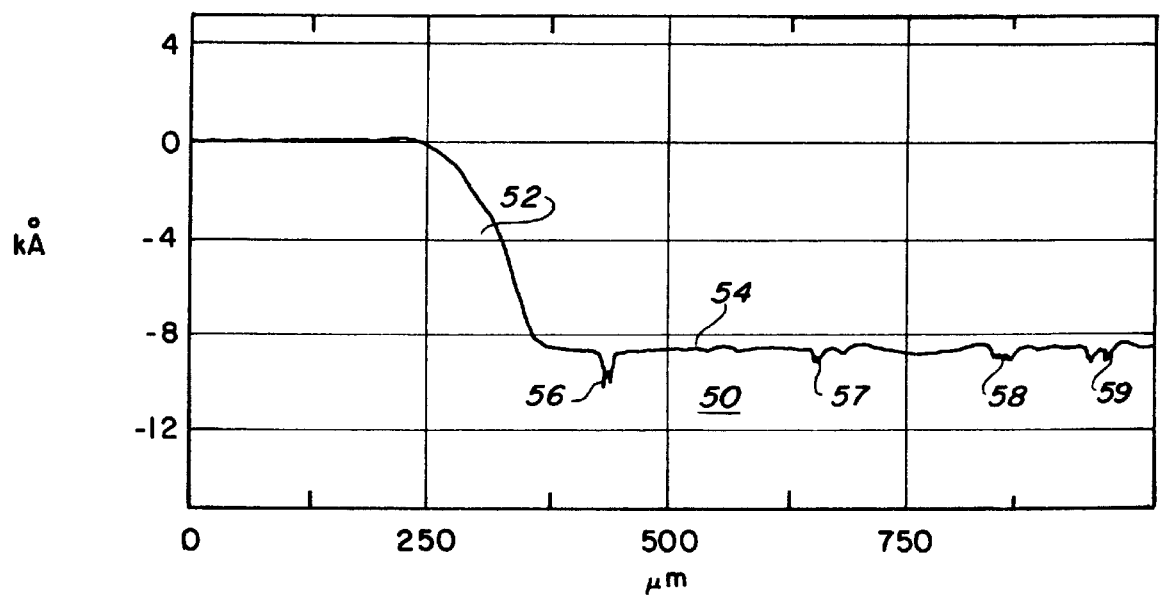
FIG. 5 is a graph which illustrates surface discontinuities when etching solution $2HNO_3:1HCl:H_2O$ was used to etch InP surface for 300 seconds.
Figure 6:
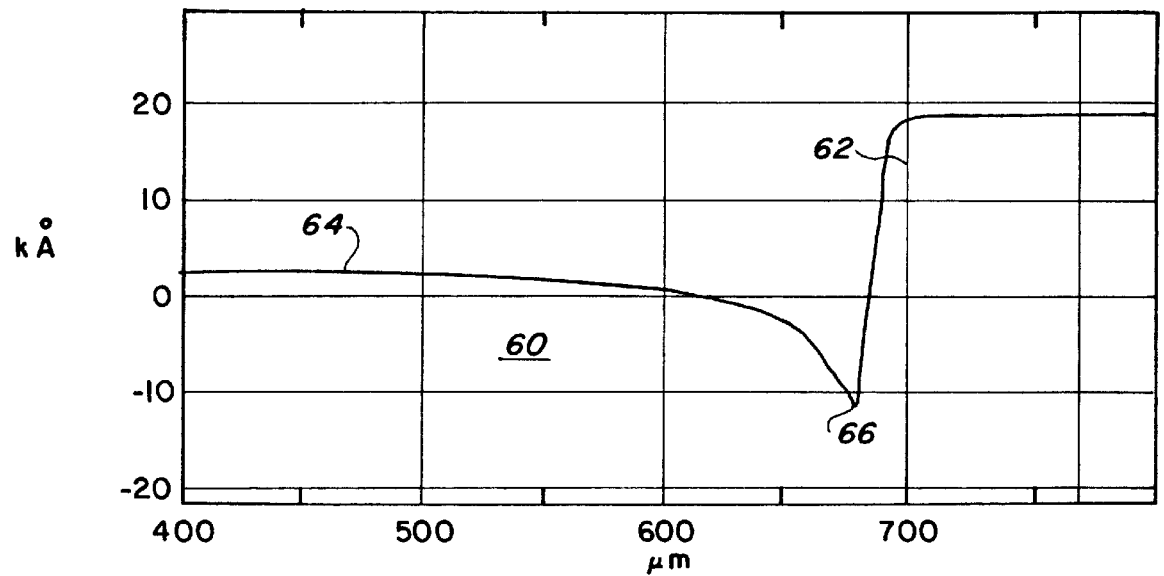
FIG. 6 is similar to FIG. 5 except the etching solution was $2HNO_3:1HCl:4LA$.

Graphs in FIGS. 5 and 6 are related in that a nitric acid etch was used in each. In FIG. 5, the etch was $2HNO_3:1HCl:2H_2O$, its etch rate was about 30 Å/second and the etch period was 300 seconds. The graph of FIG. 5 shows InP electronic device 50 with step 52 of about 9,000 Å in height. Etched horizontal surface 54 appears to be rough with pit 56 about 1,000 Å below surface 54 with other surface discontinuities such as pits 57, 58 and 59 that appear to be less than 1,000 Å below horizontal surface 54.

The etch of FIG. 6 was $2HNO_3:1HCl:4LA$, its etch rate was about 50 Å/seconds and the etch period was 300 seconds. InP electronic device 60, as represented in FIG. 6, was characterized by step 62 projecting above smooth surface 64 with pronounced trench 66 connecting surface 64 to step 62.

Figure 7:
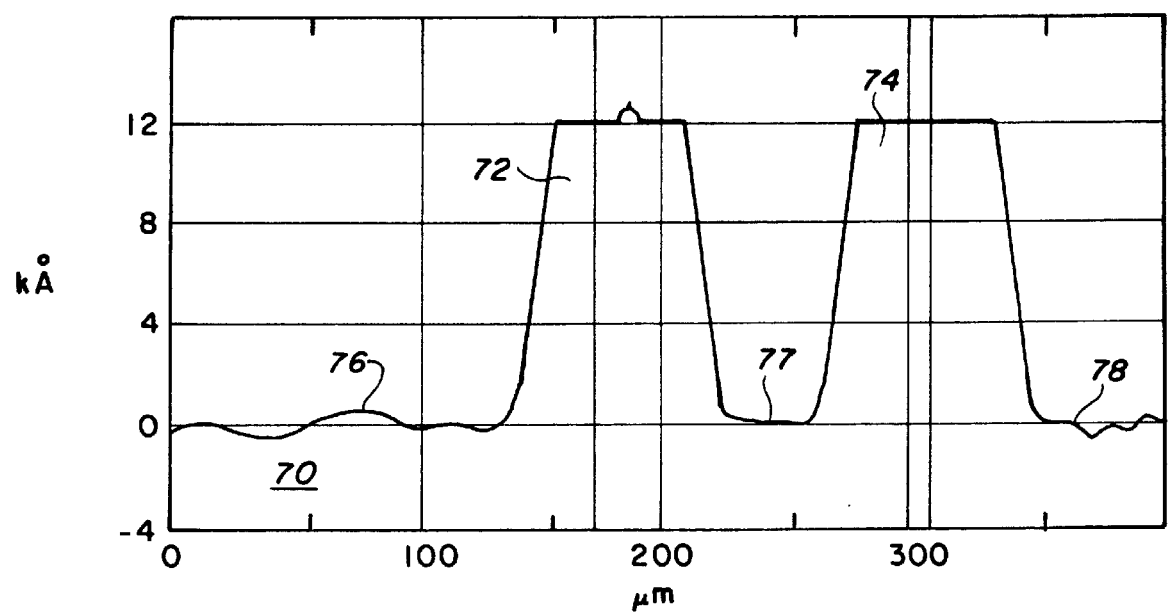
FIG. 7 is a graph which illustrates InP surface discontinuities after a 300 second etching with etching solution of $1HCl:9H_3PO_4$.
Figure 8:
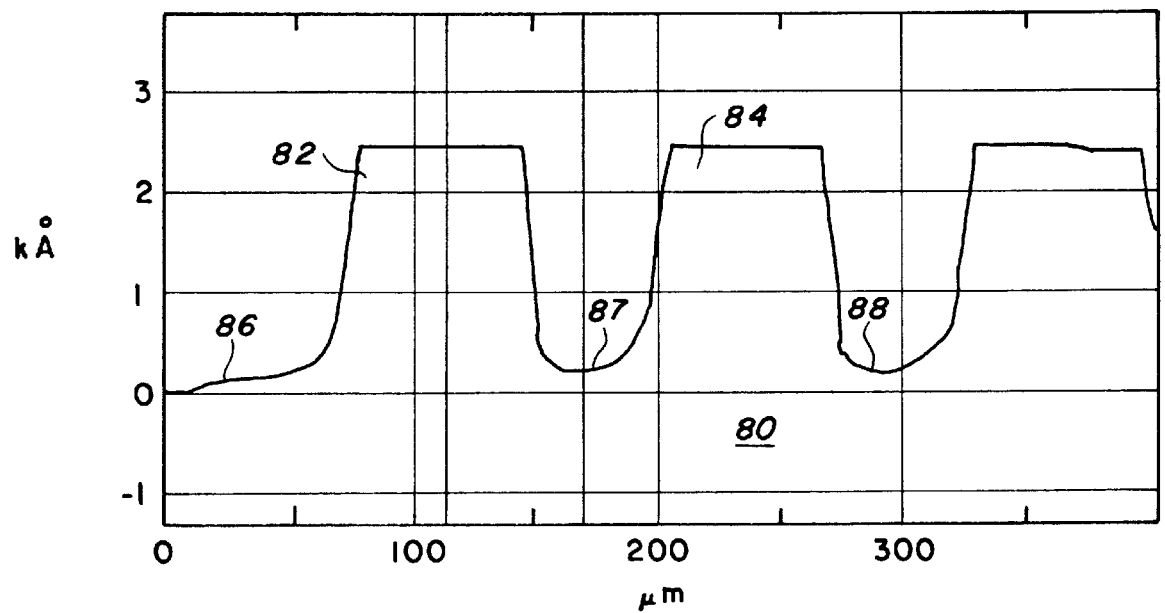
FIG. 8 is similar to FIG. 7 except the etching solution was $1HCl:9H_3PO_4:2LA$.

FIGS. 7 and 8 are related in that a phosphoric acid etch was used in each. In FIG. 7, the etch was $1HCl:9H_3PO_4$, its etch rate was about 40 Å/second and its etch period was 300 seconds. The graph of FIG. 7 shows InP electronic device 70, as represented on the graph, with a pair of spaced steps 72, 74. Horizontal surface 76 is rough, surface 77 between the spaced steps 72, 74 appears to be smooth, and surface 78 to the right of step 74 is rough and extends below surface 76.

In FIG. 8, the etch was $1HCl:9H_3PO_4:2LA$, its etch rate was about 8 Å/second and the etch period was 300 seconds. FIG. 8 shows InP electronic device 80, as represented on the graph, with a pair of spaced steps 82, 84 generally horizontal and surfaces 86, 87, 88. Although surfaces 86, 87, 88 curve and surfaces 87, 88 appear to be concave, surfaces 86, 87, 88 are relatively smooth, especially when compared to surfaces 76 and 78 of FIG. 7.

In preparing a wafer containing induim phosphide for etching or polishing or another treatment, the wafer may be patterned with a resist which protects the underlying surface from attack by the etch. The resist that is typically employed is Shipley's series 1400 photoresist, such as 1400-27 positive photoresist, although any other suitable resist can be used. The etch method is effected by immersing the wafer in the etch for a duration to etch the exposed or unpatterned surfaces of the wafer to the desired extent and then removing the wafer for testing or further processing.

Selectivity of etching or treating of indium phosphide or a related compound with a mixture containing lactic acid is maintained and the etched surface is smoother than when etched without lactic acid in the mixture. Certain compositions can be used in specific situations to either treat or leave a surface unaffected thereby. For example, the mixture containing nitric acid, hydrochloric acid and lactic acid will etch InGaAs lattice faster than an indium phosphide (InP) lattice. The mixture containing hydrochloric acid, phosphoric acid and lactic acid, however, will not etch InGaAs at all.

The compositions containing lactic acid disclosed and claimed herein, can also be used to polish indium phosphide structures or wafers or structures containing indium phosphide. The polishing compositions can also be lactic acid or conventional polishing compositions to which lactic acid is added to achieve the desired smooth surface characteristics.

In a typical polishing process, a polishing pad is disposed over a wafer or the wafer is disposed over the pad and the pad or the wafer is rotated under pressure while a polishing slurry or composition is dripped onto the wafer or the pad. The polishing pad is made of an artificial fabric and the polishing composition typically contains colloidal fine particles of silica of less than 100 Å in an aqueous solution containing lactic acid. The pressure is typically $70/cm^2$, duration is typically less than one hour and the desired smoothness is typically 10–50 Å, although even smoother surfaces can be obtained using this procedure, depending on the size of the atoms in the wafer and other factors.

Having described the invention, the following example is given as a particular embodiment thereof and to demontrate the practice and advantages thereof. It is understood that the example is given by way of illustration and is not intended to limit the specification or the claims in any manner.

EXAMPLE

This example demonstrates preparation of an etch containing lactic acid, etching method of a patterned InP electronic device with the etch containing lactic acid, and an InP elctronic device with etched smooth mirror-like surface.

The etch $2H_2O:1HIO_3:0.5LA$, on volume-weight-volume basis, was prepared by mixing water, crystalline iodic acid and concentrated lactic acid in respective proportions of 2 ml, 1 g and 0.5 ml. The resulting etch solution was colorless.

Indium phoshide wafer measuring about 5 mm×5 mm×0.025 mm and patterned with Shipley 1400-27 positive photorist was placed into a beaker containing the continuously stirred etch solution $2H_2O:1HIO_3:0.5LA$ for a period of 600 seconds. The resist was a novolac resin, diazo oxide inhibited, positive photoresist in an organic solvent system. Etched step was measured with the resist and without. The etch rate was calculated after the 600 second immersion to be about 7.5 Å/second.

FIG. 2 graph illustrates etching of the wafer with the etching solution measured with Tencor Alpha stepper 250 which can measure surface discontinuities down to about 10 Å level.

The indium phosphide electronic device thus obtained had etched specular surfaces without any surface features. The etched surfaces on this device are considered to be smooth and mirror-like with surface irregularities below about 50 Å in vertical extent down to about 10 Å. Surface roughness was measured with stylus type surface profiler.

While presently preferred embodiments have been shown of the invention disclosed herein, persons skilled in this art will readily appreciate that various additional changes and modifications may be made without departing from the spirit of the invention as defined and differentiated by the following claims.

What is claimed is:

1. A method comprising the steps of
   (a) contacting a device made of a material containing indium phosphide with an aqueous solution that is prepared by mixing at least 1% by volume of lactic acid with a liquid medium and a substance selected from the group consisting essentially of iodic acid, hydrochloric acid, phosphoric acid, sulfuric acid, acetic acid and mixtures thereof; the device having at least one area which is subject to attack by the solution; the solution is effective in obtaining reduced surface roughness compared to the same solution devoid of lactic acid;
   (b) maintaining the device in contact with the solution for a period of time necessary to remove at least some of the indium phosphide from the area subject to the attack to form a processed device; and
   (c) removing the processed device from contact with the solution.

2. The method of claim 1 wherein said step of contacting a device is polishing.

3. The method of claim 1 wherein preparation of the composition also includes step of mixing lactic acid with iodic acid; and wherein the effective amount is at least about 10% by total volume and up to about 50% by total volume.

4. The method of claim 1 wherein preparation of the composition also includes the step of mixing lactic acid with at least one component selected from the group consisting of nitric acid, phosphoric acid, acetic acid and mixtures thereof; and wherein the effective amount is at least about 10% by total volume and up to about 50% by total volume.

5. The method of claim 1 wherein preparation of the composition includes the step of mixing lactic acid at least one component selected from the group consisting of hydrochloric acid, phosphoric acid, acetic acid and mixtures thereof.

6. The method of claim 5 wherein the effective amount is about 10% by volume and wherein said step of contacting a device is etching the device which is partly covered by a photoresist.

* * * * *